(12) United States Patent
Seidl

(10) Patent No.: US 7,323,357 B2
(45) Date of Patent: Jan. 29, 2008

(54) METHOD FOR MANUFACTURING A RESISTIVELY SWITCHING MEMORY CELL AND MEMORY DEVICE BASED THEREON

(75) Inventor: Harald Seidl, Pöring (DE)

(73) Assignee: Qimonda AG, Munich (DE)

( * ) Notice: Subject to any disclaimer, the term of this patent is extended or adjusted under 35 U.S.C. 154(b) by 153 days.

(21) Appl. No.: 11/280,864

(22) Filed: Nov. 17, 2005

(65) Prior Publication Data

US 2007/0111333 A1    May 17, 2007

(51) Int. Cl.
*H01L 21/06* (2006.01)
(52) U.S. Cl. ............... 438/102; 257/296; 257/E21.524; 438/95; 438/103; 438/267
(58) Field of Classification Search ......... 438/102, 438/103, 95, 622, 267, 275, 605, 437, 180; 257/296, E21.524
See application file for complete search history.

(56) References Cited

U.S. PATENT DOCUMENTS 5,667,632 A     9/1997 Burton et al.
6,514,788 B2    2/2003 Quinn
6,589,714 B2    7/2003 Maimon et al.
6,930,913 B2 *  8/2005 Pellizzer et al. ............ 365/163
7,122,824 B2 * 10/2006 Khouri et al. ................. 257/2
2003/0122156 A1 7/2003 Maimon
2005/0191804 A1 9/2005 Lai et al.

FOREIGN PATENT DOCUMENTS

DE     10-2004-014-487 A1    11/2005

* cited by examiner

*Primary Examiner*—Kiesha L. Rose
*Assistant Examiner*—Chakila D Tillie
(74) *Attorney, Agent, or Firm*—Slater & Matsil, L.L.P.

(57) ABSTRACT

The invention relates to a method for manufacturing at least one phase change memory cell. The method at least fabricating at least one first lamellar spacer of conductive material, which is electrically coupled to the PCM material of the memory cell; fabricating at least one second lamellar spacer on top of the first lamellar spacer, wherein the second lamellar spacer crosses the first lamellar spacer in the area of the PCM material; partially removing the first lamellar spacer, wherein the second lamellar spacer serves as a hardmask for partially removing the first lamellar spacer, so that the first lamellar spacer forms at least one electrode contacting an area of PCM material.

18 Claims, 11 Drawing Sheets

METHOD FOR MANUFACTURING A RESISTIVELY SWITCHING MEMORY CELL AND MEMORY DEVICE BASED THEREON

TECHNICAL FIELD OF THE INVENTION

The invention relates to a method for manufacturing a resistively switching memory cell, and in particular, to a phase change memory cell, and to a corresponding memory device comprising at least one memory cell.

BACKGROUND OF THE INVENTION

Phase change random access memory (PCRAM) makes use of the property of the phase change material (PCM) being conductive in crystalline state and comparatively non-conductive in an amorphous state. The conductive crystalline state can be assigned a logic 1 and the non-conductive amorphous state can be assigned a logic 0 respectively. The material used typically is a chalcogenide compound, e.g. $Ge_2Sb_2Te_5$ ("GST") or an Ag—In—Sb—Te compound.

The phase change from an amorphous state, that is the comparatively non-conductive state, into the crystalline state requires heating the material for a short time above the glass transition temperature without melting the material. This can be achieved in that the material is placed between two electrodes and an appropriate heat current pulse. The heat current pulse must be strong enough to heat the material above its glass transition temperature, so that the material crystallizes.

Vice versa a phase change from the crystalline phase to an amorphous state can be achieved by heating the material for a short time beyond the melting temperature with subsequently "quenching", that is rapidly cooling off, the material into an amorphous state, thus erasing the logic 1 to 0.

For the above mentioned $Ge_2Sb_2Te_5$ (GST) the melting temperature is at around 600° C., the glass transition temperature is at around 300° C. typically and the crystallization time is around 50 ns.

To achieve a correspondingly quick heating of the switching active material beyond the crystallization or melting temperature, respectively, relatively high currents may be necessary, which may cause correspondingly high power consumption.

Furthermore, the consequence of high heating currents may be that the corresponding cell can no longer be controlled by an individual transistor with small structure size. This may result in a corresponding—possibly strongly reduced—density of elements on the respective memory device.

So far one has primarily been trying to restrict the programmed volume by a reduction of the contacting surface and to thus reduce the required currents.

Previous concepts are inter alia described in: S. J. Ahn, Y. N. Hwang et al., "Highly reliable 50 nm contact cell technology for 256 Mb PRAM", Samsung Electronics, Symposium on VLSI Technology Digest of Technical Papers, wherein a ring-shaped contact structure is proposed so that the current flows through the perimeter of the ring-shaped contact.

SUMMARY OF THE INVENTION

The invention provides a method for precise and well reproducible manufacturing of a PCRAM memory cell having a small electrode contact and furthermore a small volume of PCM material and a corresponding memory cell.

According to a first embodiment of the invention, there is a method for manufacturing at least one resistively switching memory cell, in particular a phase change memory (PCM) cell comprising PCM material, the method comprising: (a) fabricating at least one first lamellar spacer of conductive material, which is electrically coupled to the PCM material of the memory cell; (b) fabricating at least one second lamellar spacer on top of the first lamellar spacer, wherein the second lamellar spacer crosses the first lamellar spacer in the area of the PCM material; (c) partially removing the first lamellar spacer, wherein the second lamellar spacer serves as a hardmask for partially removing the first lamellar spacer, so that the first lamellar spacer forms at least one electrode contacting an area of PCM material.

The invention enables a manufacturing of very small electrode contacts on an area of PCM material. The size of the contact area of the electrode in combination with a predefined current defines the current density. Hence a small contact area with a relatively low current produces a high current density. The high current density produces heat needed for a phase change of the PCM material. Thus by reducing the contact area between the electrode of the memory cell and its PCM material smaller currents and thus less energy are needed for a phase change of the cell.

BRIEF DESCRIPTION OF THE DRAWINGS

In the following embodiments of the invention will be described in more detail with reference to the FIGS. , which show a sequence of drawings showing the chip during the fabrication of the memory cells.

DETAILED DESCRIPTION OF THE INVENTION

Figure 1A:
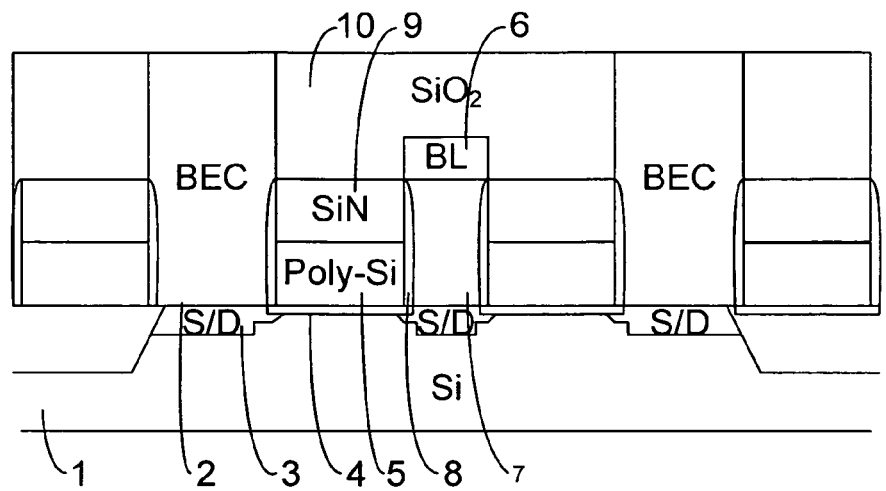
FIGS. 1a-1c show a semiconductor chip during the manufacturing of the PCM memory cells prior to executing the new method steps.

FIG. 1a shows a cross section through a chip prior to executing the method steps according to the invention. On the substrate 1 there is a bottom electrode contact (BEC) 2, which can be accessed by an access transistor comprising a source/drain 3, a gate area 4 and a gate 5. The source/drain 3 of the access transistor is connected to a bit line 6 via a bit line connector 7. The gate 5 of the access transistor is isolated from the environment by spacers 8 and an insulation block 9 on its top. Interspaces between the functional elements of the chip are filled by an inter layer dielectric 10.

Figure 1B:
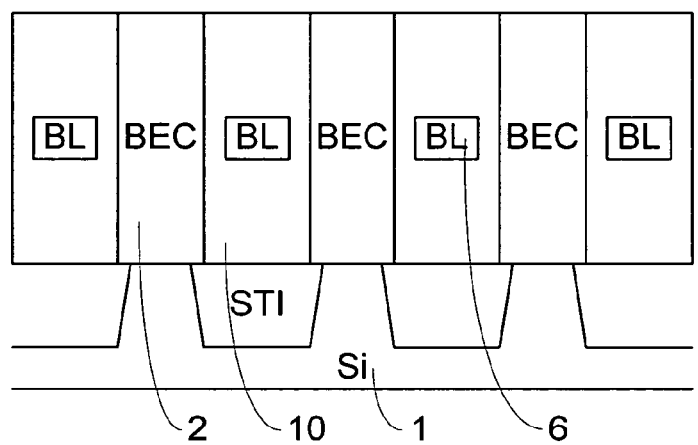

FIG. 1b shows a cross section through the chip as specified by intersecting line B-B'. The BECs 2 and the bit lines 6 are separated by the insulating inter layer dielectric 10. Furthermore there is a shallow trench isolation (STI) 12 in the substrate 1 to isolate the BECs 2 from the substrate 1.

Figure 1C:
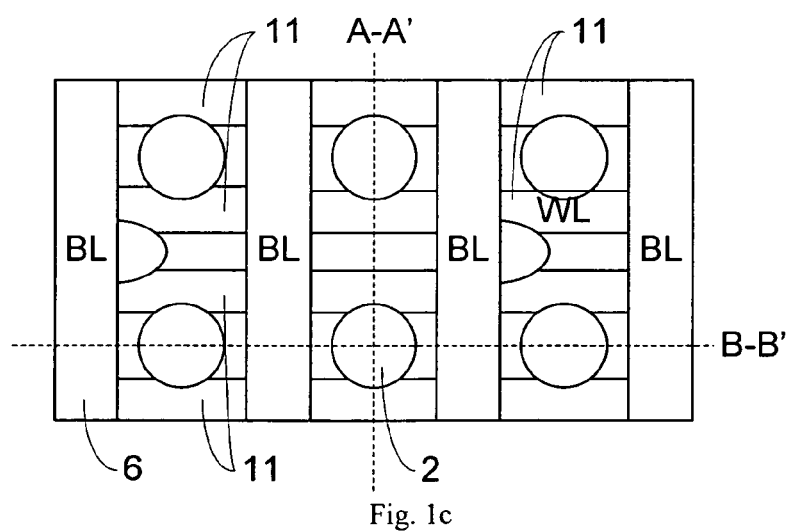

FIG. 1c is a top view of the chip. As the inter layer dielectric 10 covers the bit lines 6 and thus would hide them, it is not shown here. The dotted line A-A' specifies the intersecting line through the chip as shown in FIG. 1a and the dotted line B-B' specifies the intersecting line as shown in FIG. 1b. It can be seen that in this exemplifying embodiment there is a matrix of BECs 2 with the bit lines 6 and word lines 10 in the interspaces between the BECs 2.

In this embodiment the materials for the above-described elements can be any suitable materials known from prior art. For example the substrate 1 can be silicon Si, the bit line 6, word line 11, the BECs 2 and the source/drain 3 can be any suitable conducting material, in particular a metal. The materials for the access transistor can be any suitable material known from the art, for example the gate 5 can be made of any poly-silicon (Poly-Si) with an oxide layer of this material as a gate area 5 material and silicon nitride SiN as insulation material for the spacers 8 and block 9. The inter layer dielectric can be silicon oxide ($SiO_2$).

Figure 2A:
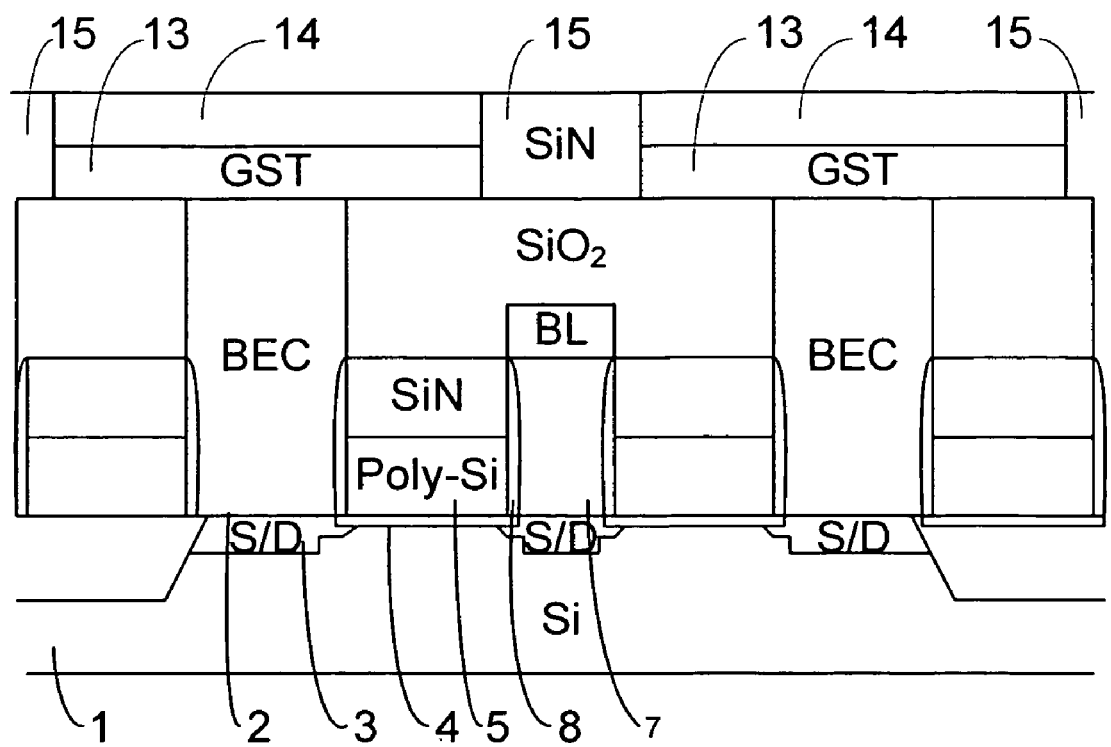
FIGS. 2a-2c show the chip with a matrix of PCM material areas.
Figure 2B:
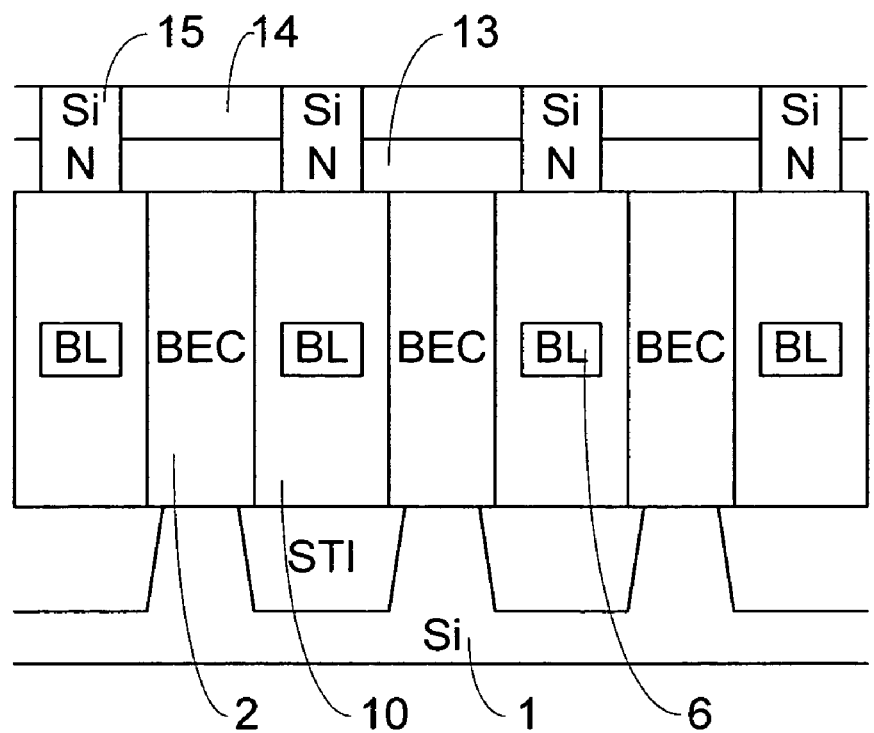

FIGS. 2a, 2b show the views as in FIGS. 1a, 1b at a later processing stage after several intermediate process steps have been performed. In a first intermediate step a layer of PCM material 13, that is the chalcogenide material, has been deposited on the chip surface by using a suitable method, which can be for example physical vapor deposition (PVD) or chemical vapor deposition (CVD) or atomic layer deposition (ALD). The thickness of this PCM layer typically is in the range 10-100 nm.

On top of the PCM material layer 13 a hardmask layer 14 can be deposited optionally. The hardmask material can be any conducting material suitable as a hardmask such as Carbon, TaSiN, TaCN. Then the hardmask layer 14 is removed partially by using a suitable and per se known lithography method with following removal of the photoresist. Subsequently the PCM layer 13 has been partially removed by using a suitable etching method, wherein the hardmask layer 14 is used as a mask for etching, so that on top of each BEC 2 the PCM material 13 is shaped into blocks covered by the hardmask material 14. The form of the PCM material 13 and the hardmask material 14 may be any suitable form, e.g. it can be foursquare or circular.

Thereafter the gaps between the blocks of PCM material 13 and hardmask material 14 are filled with a good insulating material 15, e.g. silicon nitride SiN, by depositing a layer thereof by any suitable method, e.g. CVD. This layer is planarized with the hardmask material 14 as stop using a suitable planarization method such as a known chemical-mechanical-planarization (CMP).

Figure 2C:
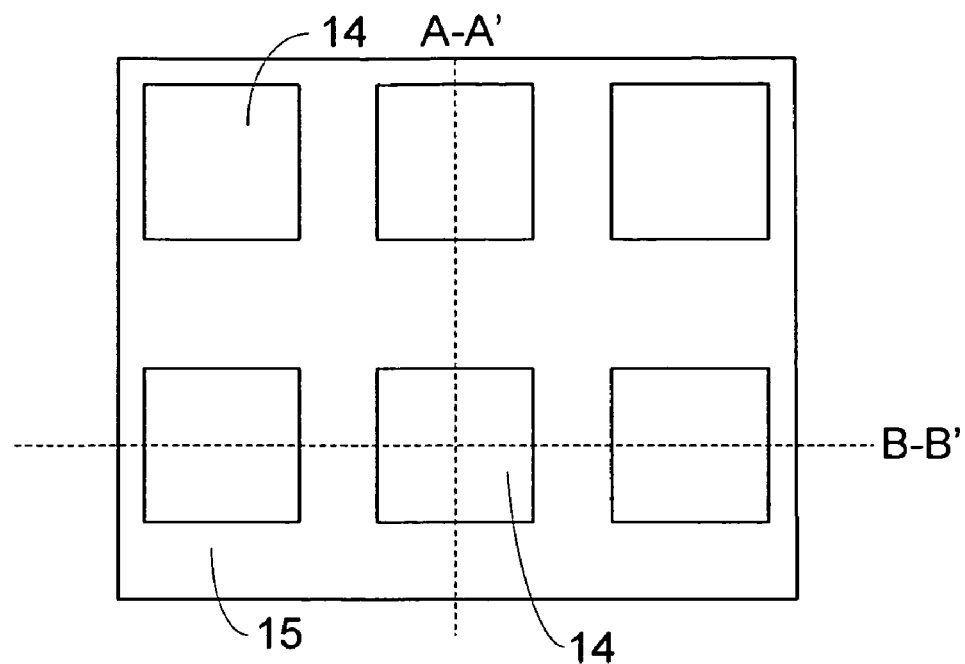

FIG. 2c is a top view onto the chip showing the matrix of blocks of hardmask material 14 with the gaps between these blocks filled with insulating gap filler material 15.

Figure 3A:
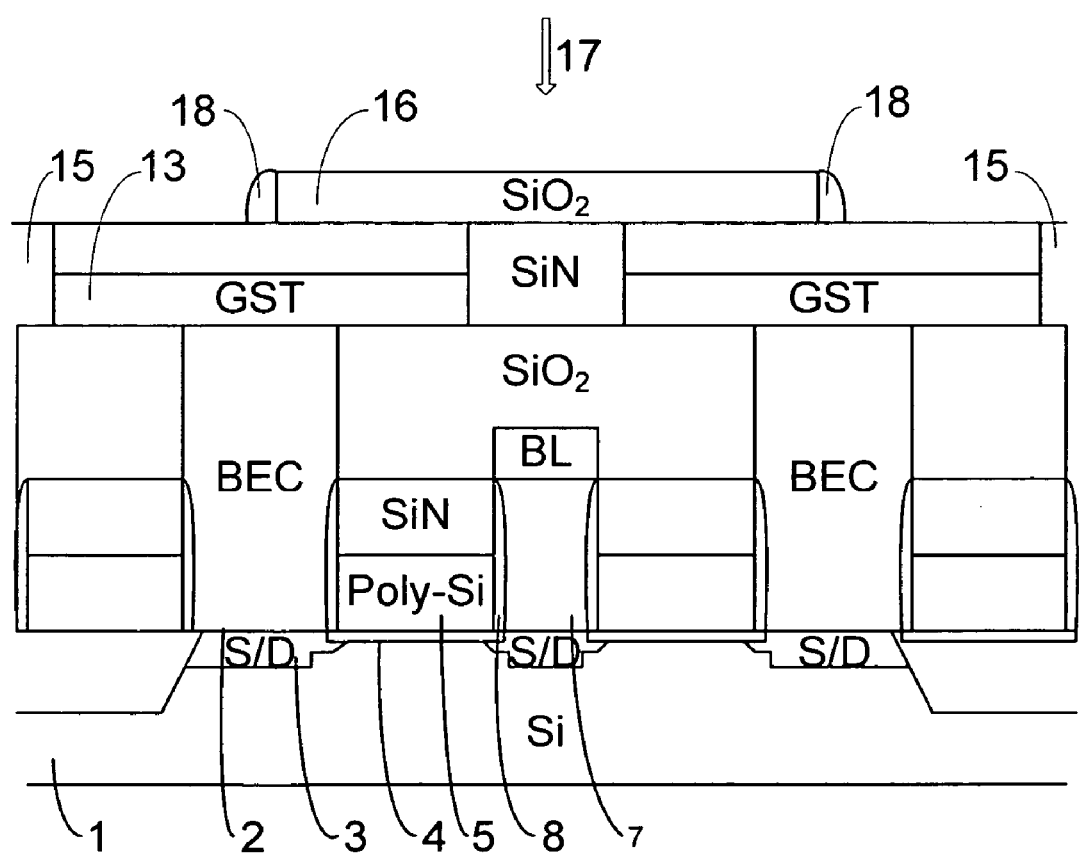
FIGS. 3a-3b show the chip with first lamellar spacers.

FIG. 3a shows a cut through the chip as in FIGS. 1a, 2a after having performed further process steps. A further layer of a suitable insulating material is deposited on the chip surface, which subsequently is partially removed so that lamellar blocks 16 of insulating material were shaped by using a known lithography procedure with subsequent etching and removal of the photo resist. The lamellar blocks 16 are shaped so that at least one flange of a block 16 is located on top of a PCM material area 13 or a hardmask area 14 and preferably above the area of a BEC 2. After having created the lamellar blocks 16 a layer of conducting electrode material is deposited onto the surface using a process such that the layer of electrode material conforms to the surface structure of the chip. A suitable procedure is a CVD or ALD process. The layer of electrode material typically has a thickness of 5 to 20 nanometer, which will later be one horizontal dimension of the top electrode.

Subsequently the layer of conducting electrode material is partially removed by using anisotropic etching such that the electrode layer material is removed from surfaces being horizontal in the drawings. The anisotropic etching process is stopped when the surface of the PCM material 13 or the optional hardmask material 14 is reached.

A suitable method for such an anisotropic etching is reactive ion etching (RIE), which per se is known from prior art. Such an etching process removes the layer of electrode material vertically as indicated by arrow 17. As the thickness of the electrode material layer in vertical direction is bigger at the flanges of a block 16 the first lamellar spacers 18 of electrode material are maintained.

Figure 3B:
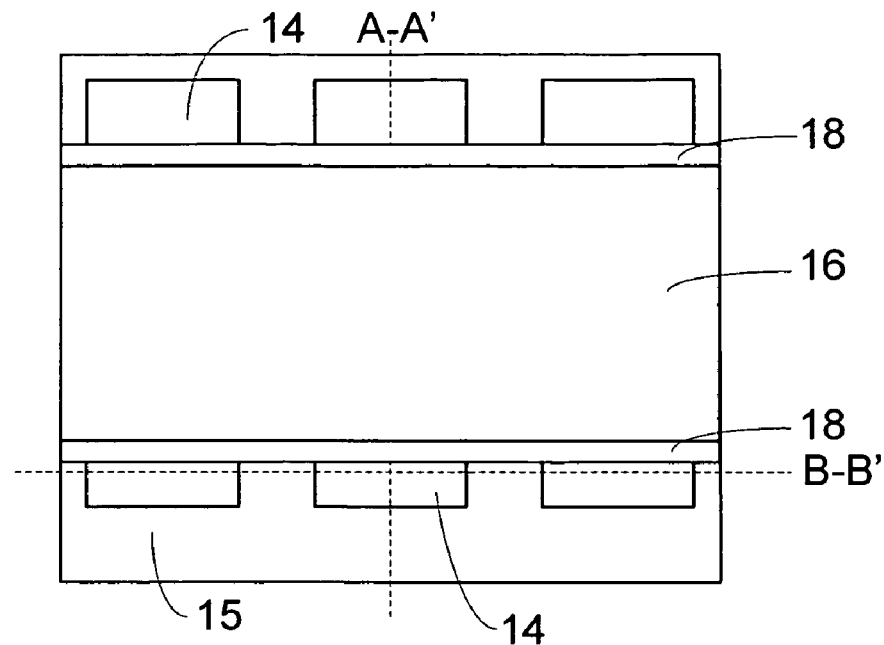

FIG. 3b shows a top view onto the chip surface. The flange of a first lamellar block 16 runs on top of a row of adjacent areas of PCM material 13 or optional hardmask material 14 respectively and is positioned such that first lamellar spacers 18 run on the centerline of the areas of PCM material 13 or hardmask material 14. In a preferred embodiment blocks 16 are positioned such that one flange runs across a first row of PCM material 13 or hardmask 14 areas and the second flange of same block 16 runs across an adjacent row of PCM or hardmask material areas 13, 14.

Figure 4A:
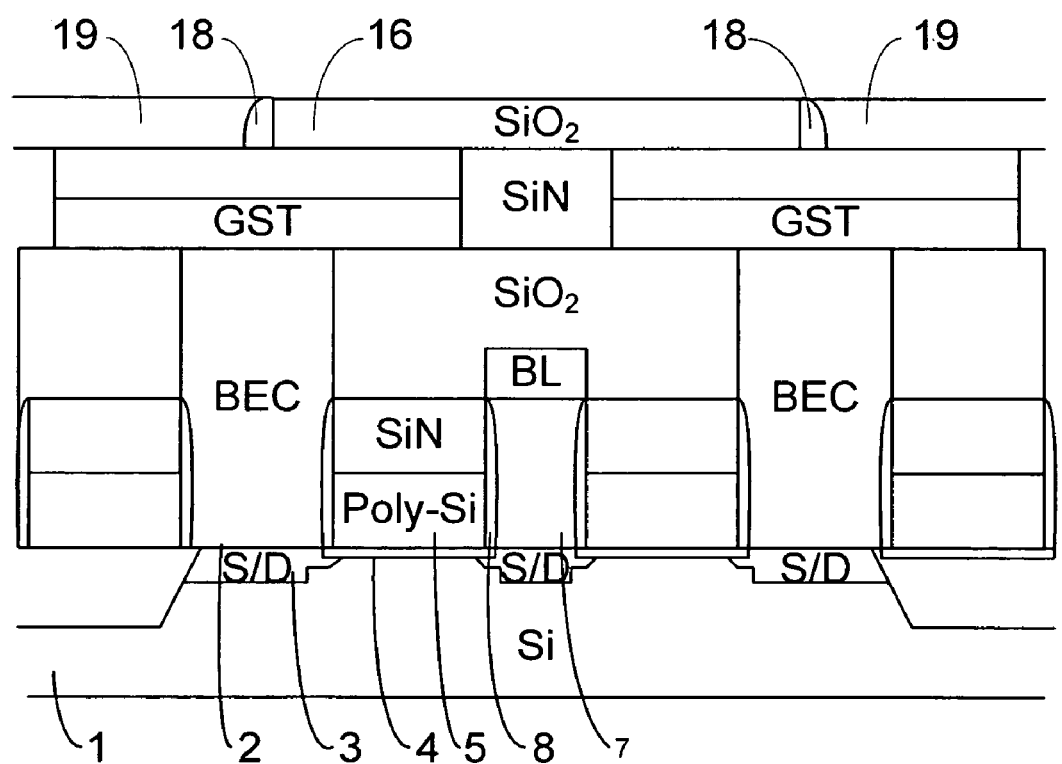
FIGS. 4a-4c show the chip with second lamellar spacers.
Figure 4B:
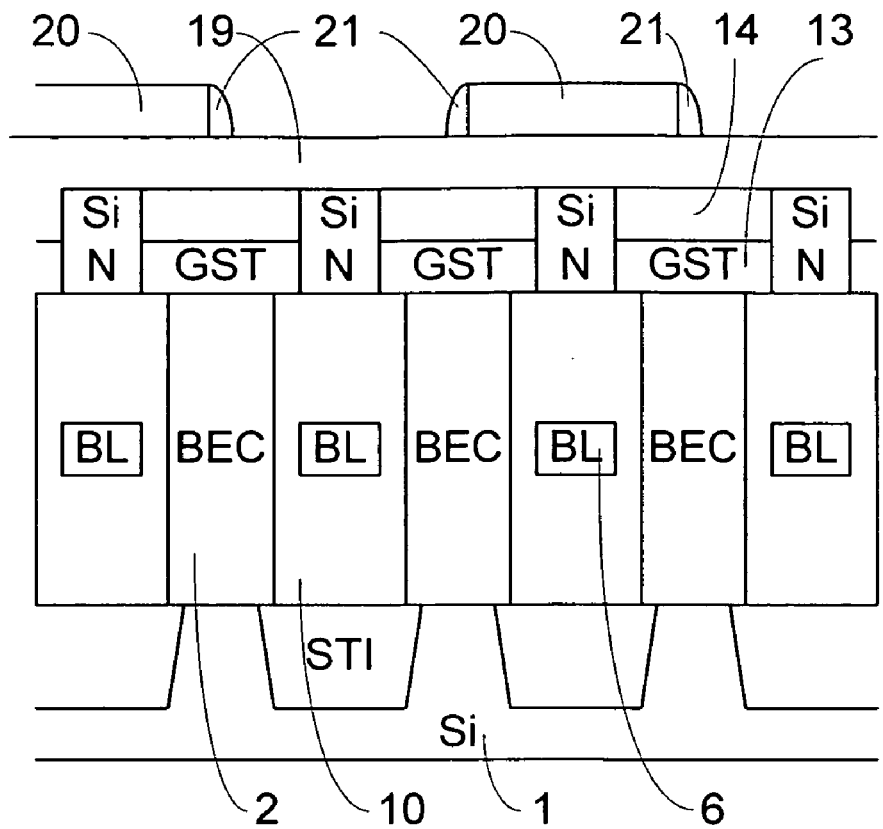

FIGS. 4a and 4b show views along intersecting lines A-A' and B-B' after having performed further process steps. After having created the first lamellar spacers 18 the gaps between them are filled with an insulating filler material 19 by depositing a suitable layer on the chip surface and by subsequently planarizing the layer. A suitable filler material can be $SiO_2$ for example being deposited by a CVD process with a following CMP planarization. After having performed these steps as a preparation for the next steps the surface of the chip is planar. The top layer on the chip surface is an insulation layer with embedded first lamellar spacers 18 of electrode material.

In the next process steps blocks 20 are created on the chip surface for subsequently creating second lamellar spacers 21. Similar to creating the first lamellar blocks 16 at first a layer of material is deposited, by using e.g. a CVD process, and then partially removed at undesired areas using a lithography process with etching and photo resist removal. A suitable material for this layer must be selectively etchable with respect to the underneath lying layer. In this embodiment, as the underneath lying layer is of $SiO_2$ and TiN a suitable material can be SiN.

The blocks 20 are positioned so that their flanges cross the first lamellar spacers 18 on top of the areas of PCM material 13 or hardmask material 14. Preferably the blocks 20 are located so that their flanges are orthogonal to the first lamellar spacers 18 so that on top of each area of PCM material 13 or hardmask material 14 a flange of a block 20 crosses a first lamellar spacer 18.

Next, the second lamellar spacers 21 are created in a similar way as described above for the first lamellar spacers 18. For this purpose a layer of the material of the second lamellar spacers 21 is deposited conformly on the surface of the chip by using a suitable method, e.g. CVD. The layer is then partially removed using an anisotropic etching method, e.g. by using an RIE method, which removes the layer material on horizontal—in the FIGS.—areas, but leaves the material agglomerations at the flanges of the blocks 20 which form the desired second lamellar spacers 21. The underneath lying layer embedding the first lamellar spacers 18 can be used as a stop when etching the top layer anisotropically.

The material of the second spacers 21 must be selectively etchable with respect to the underlying layer of insulating material and with respect to the material of the first lamellar spacers 18. In this embodiment, with the material of the first lamellar spacers 18 being TiN and the material of the underlying insulating material being $SiO_2$, the material of the second lamellar spacers 21 can be Si, which is selectively etchable to $SiO_2$ and TiN.

Figure 4C:
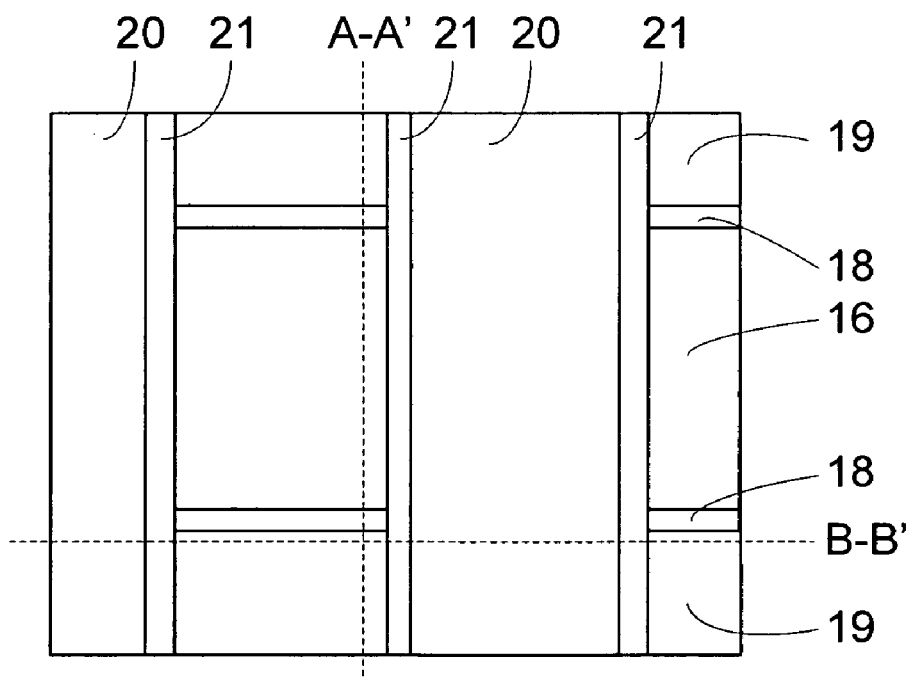

FIG. 4c shows a top view onto the chip surface. The second lamellar blocks 20 and second lamellar spacers 21 are arranged orthogonally to first lamellar spacers 18. The gaps between the first lamellar spacers 18 are filled with gap filler material 19.

Figure 5A:
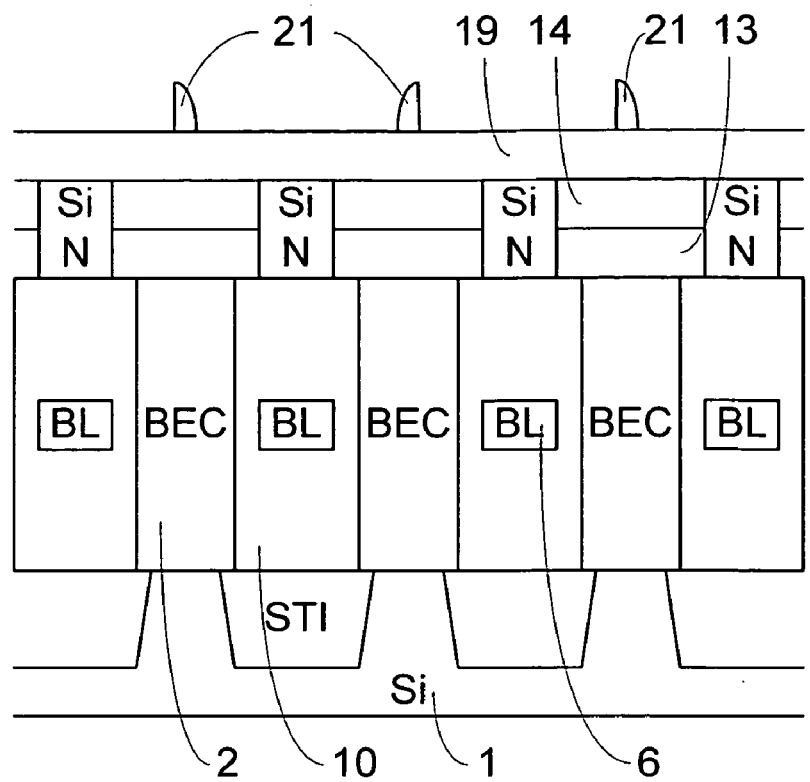
FIGS. 5a-5c show the chip after removal of the second lamellar blocks.
Figure 5B:
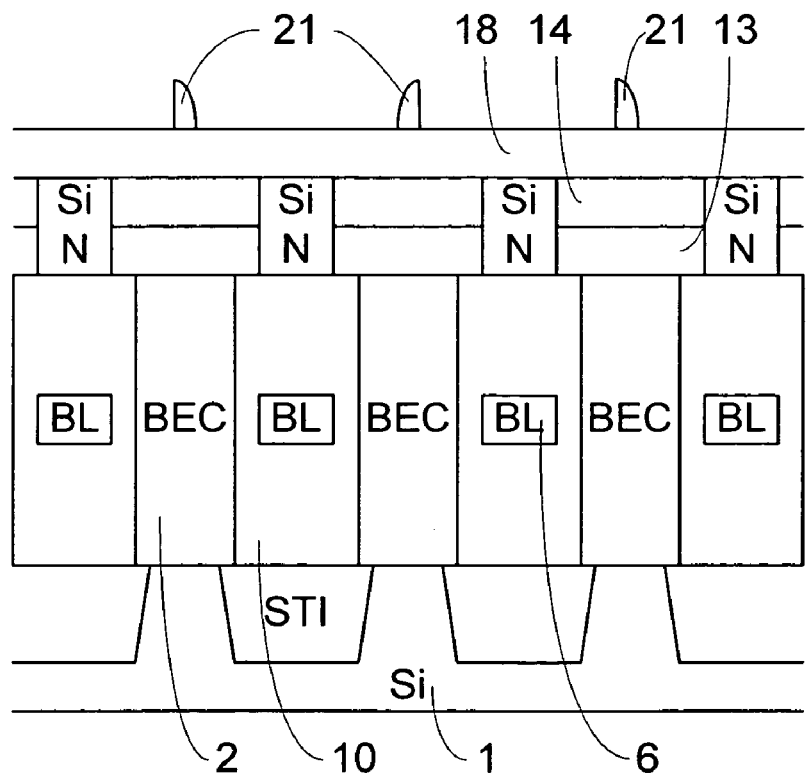
Figure 5C:
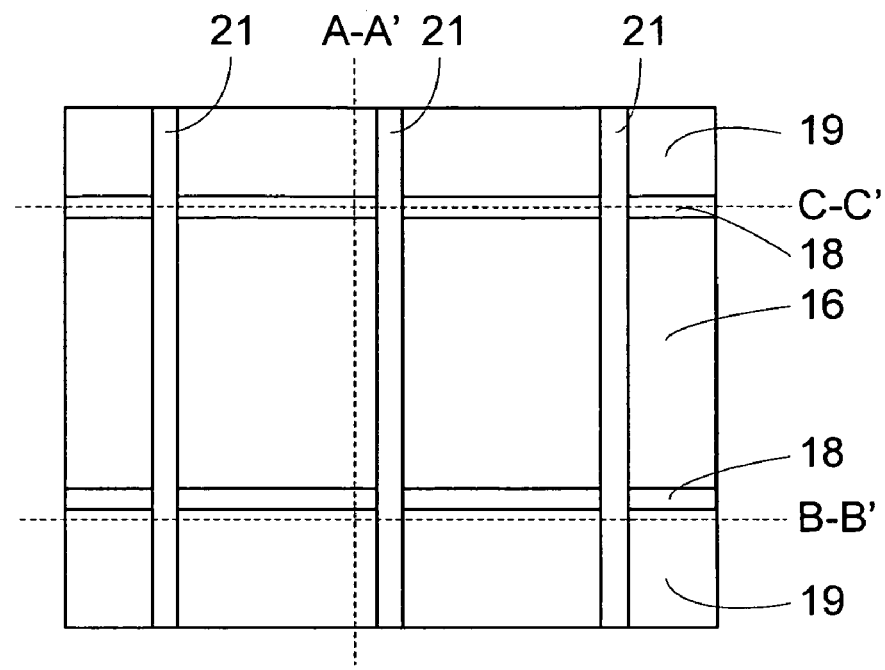

FIGS. 5a to 5c show the chip after the second lamellar blocks 20 are removed. In this embodiment the material of blocks 20 is SiN. So a suitable method for selectively removing the second lamellar blocks 20 is an etching process using e.g. hot phosphoric acid $H_3PO_4$, preferably at a temperature of >60° C.

FIG. 5a is a view along intersecting line B-B' showing the result of the last etching, that is the removal of blocks 20. As a result of this method step the second lamellar spacers 21 are sticking out of the otherwise planar chip surface.

FIG. 5b is a view along intersecting line C-C' running parallel to intersecting line B-B' and running lengthwise through a first lamellar spacer 18, so that here the second lamellar spacers 21 are standing on a first lamellar spacer 18. An area of PCM material 13 of a memory cell is located below the lamellar spacers 18, 21. As the first lamellar spacers 18 run through the center of the PCM material areas 13 and the second lamellar spacers 21 also are arranged to run through the center of an PCM material 13 area and crossing the first lamellar spacers 18, the crosspoints of the first lamellar spacers 18 with the second lamellar spacers 21 are in the center of PCM material areas 13.

FIG. 5c is a top view onto the chip. The second lamellar spacers 21 are arranged orthogonal to the first lamellar spacers 18. Although the first lamellar spacers 18 are surrounded by the layer of insulating material, namely the first lamellar blocks 16 and the gap fillers 19, it is to be noticed that the first lamellar spacers 18 are not covered entirely by the surrounding blocks 16 and gap fillers 19, so that they are accessible from the top in the next process step.

In the next process step the TiN material of the first lamellar spacers 18 is removed using the second lamellar spacers 21 as a hardmask, so that the material under the second lamellar spacers 21 is maintained, that is the blocks 16 and the gap fillers 19 as well as the first lamellar spacers 18 beneath the second spacers 21 are partially maintained and thus form a stripe of material under the second lamellar spacers 21. A suitable method for removing the TiN material of the first lamellar spacers 18 is etching with a gas being a compound of nitrogen and chlorine.

Figure 6A:
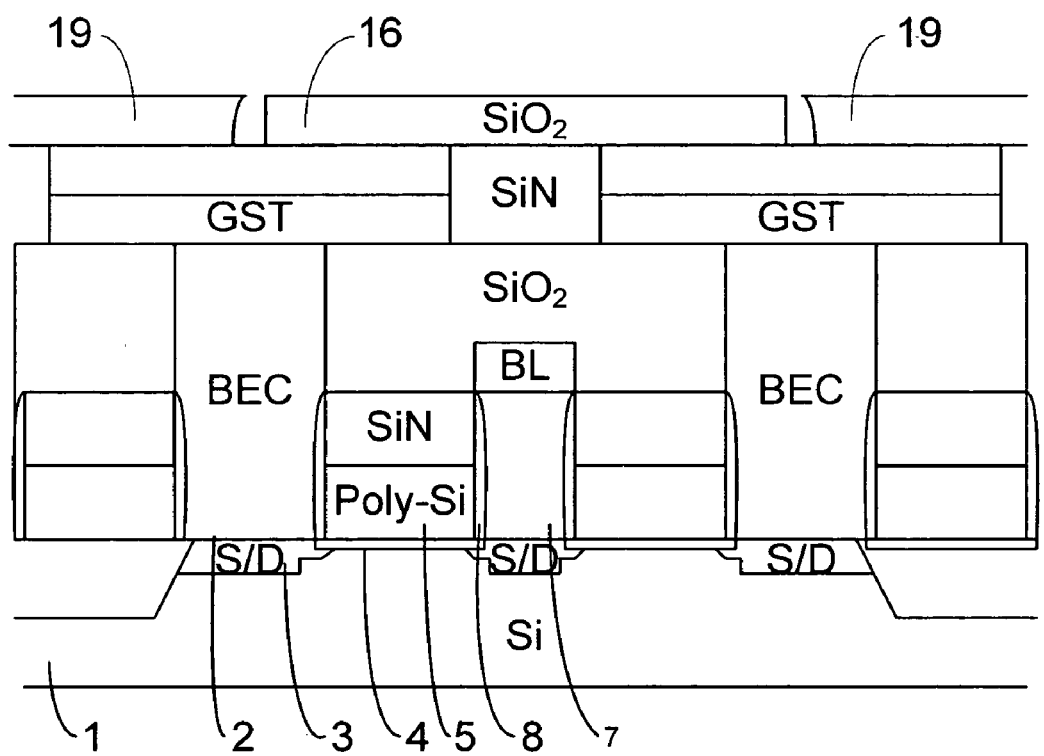
FIGS. 6a-6d show the chip after partial removal of the first lamellar spacers.

FIG. 6a shows a view along the intersecting line A-A'. The material of the first lamellar spacers 18 is partially removed thus leaving a gap between the first lamellar blocks 16 and the gap fillers 19 where the first lamellar spacers 18 have been located.

Figure 6B:
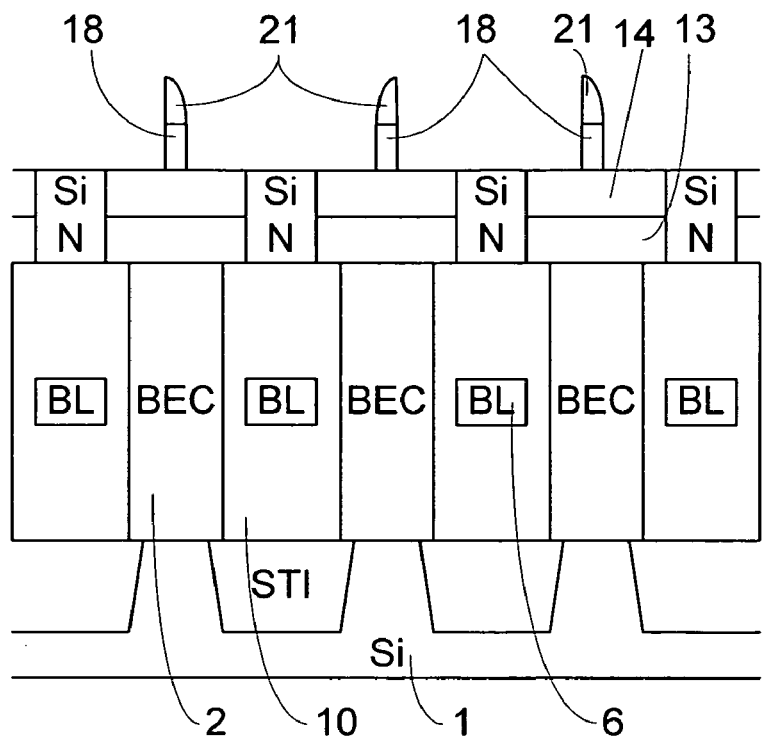

FIG. 6b is a view along intersecting line C-C' showing that a fraction of the first lamellar spacers 18 is maintained where covered by a second lamellar spacer 21. The maintained fractions of the first lamellar spacers 18 thus are shaped to pillars, because the first and second lamellar spacers 18, 21 have been arranged to cross each other.

Figure 6C:
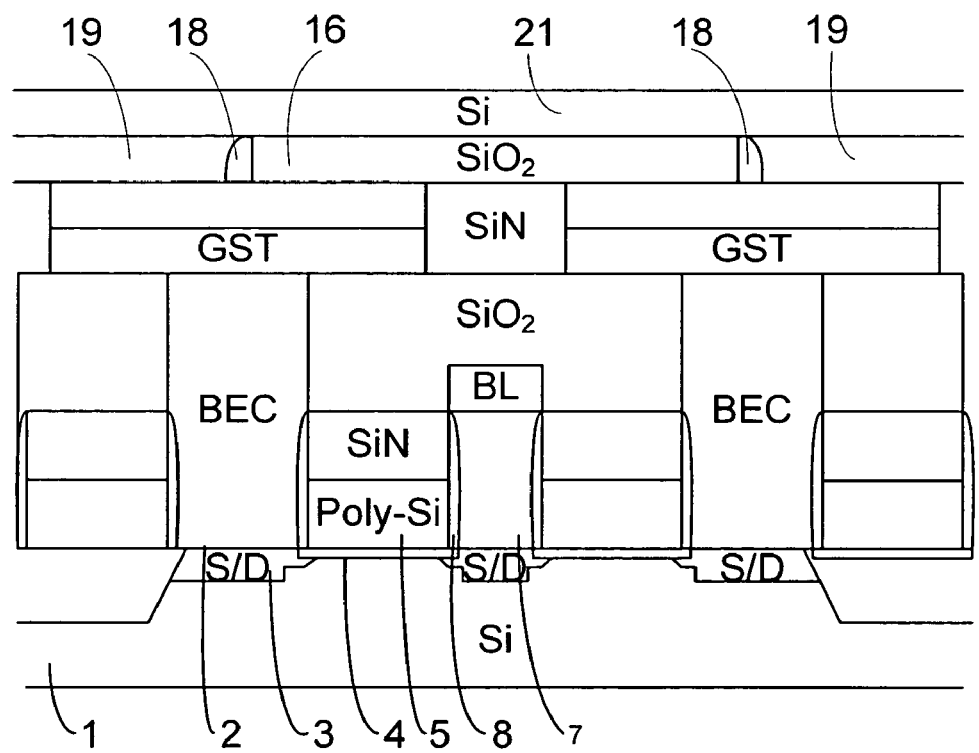

FIG. 6c is a view along the intersecting line D-D'. The intersecting line D-D' runs lengthwise through one of the second lamellar spacer 21. As can be seen the material under second lamellar spacers 21 is maintained. Hence a fraction of the material of the blocks 16, gap fillers 19 and first lamellar spacers 18 is maintained and form the stripe of material underlying the second lamellar spacers 21.

FIG. 6d is again a top view onto the chip surface, wherein the material of first lamellar spacers 18—where visible in this top view—is removed. The pillars shaped from the first lamellar spacers 18 are covered by the second lamellar spacers 21 and hence invisible in the drawing. The interspaces between the blocks 16, where the first lamellar spacers 18 are removed, now disclose a look on the hardmask 14 and the gap fillers 15.

In the next process step the material of the blocks 16 and of the gap fillers 19 and of the second lamellar spacers 21 is removed. As described afore, in this embodiment the material of the blocks 16 and the gap fillers 19 is $SiO_2$ and the material of the second lamellar spacers 21 is Si. Suitable method steps for removing these materials are a first etching process removing Si selectively to $SiO_2$, SiN, TiN and the hardmask material and following a second etching process to remove $SiO_2$ selectively to SiN, TiN and the hardmask material. In a suitable first etching method e.g. hydrofluoric acid as etching fluid is used.

Figure 6D:
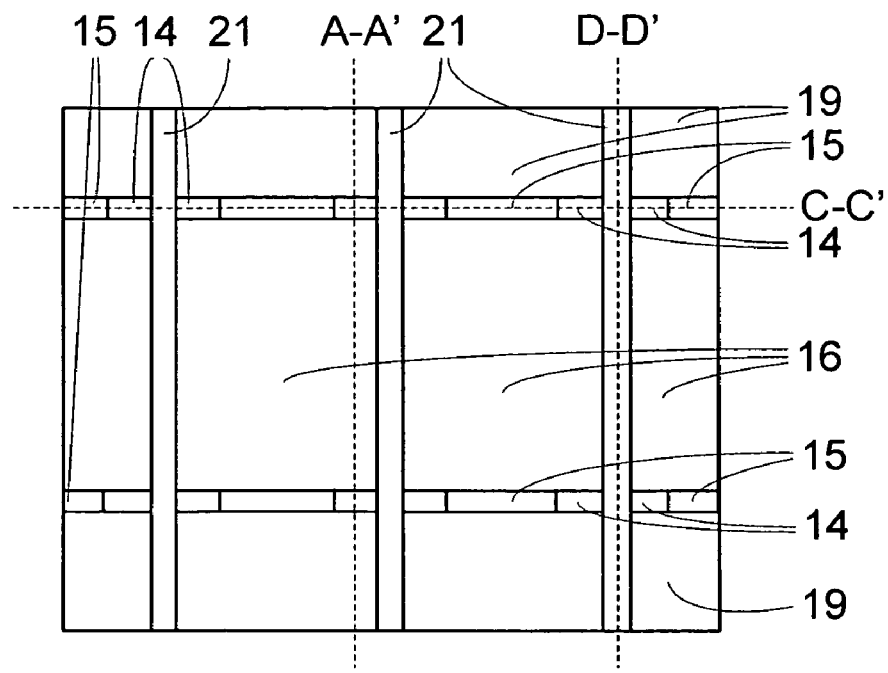
Figure 7A:
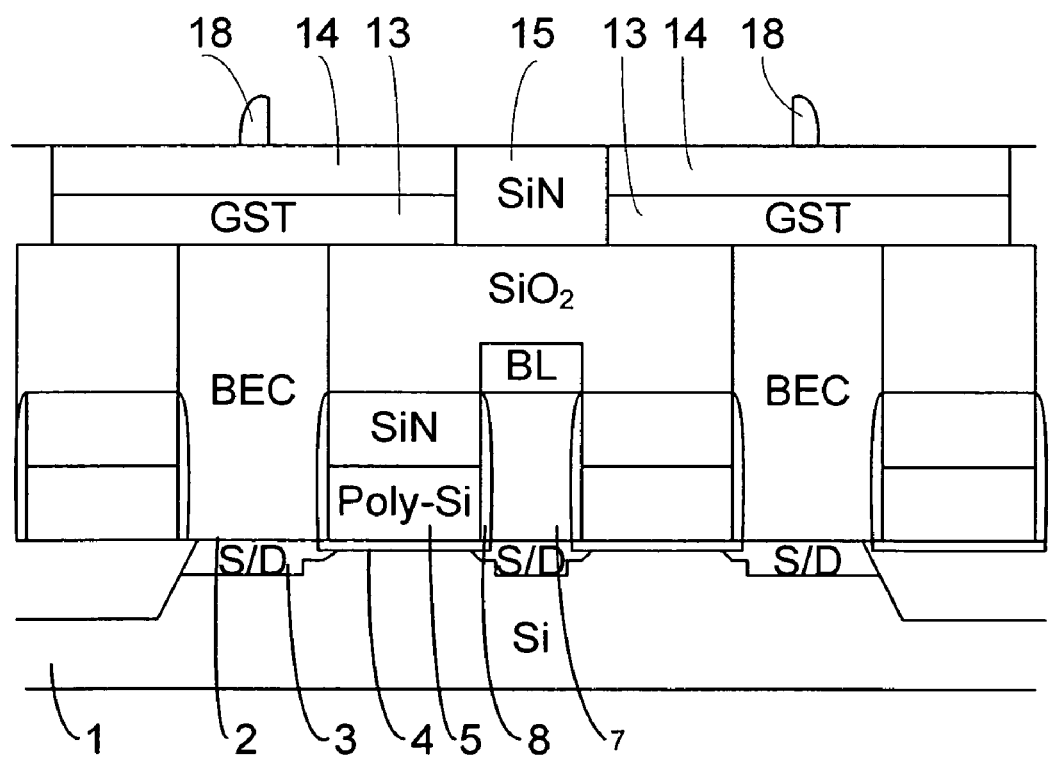
FIGS. 7a-7b show the chip after removal of the second lamellar spacers.

FIG. 7a is a view along intersecting line D-D' as specified in FIG. 6d. The second lamellar spacers 21 and the first lamellar blocks 16 and gap fillers 19 are removed. The fractions of first lamellar spacers 18 protrude perpendicular to the hardmask area 14 and are located in or near to the center of the hardmask area 14. Though it is desirable to place the contact of the memory cell in the center of the PCM material, any location wherein the contact electrically contacts the PCM material principally will work. Therefore the fractions of the first lamellar spacers 18, which will serve as electrode, do not necessarily have to be placed in the center of the PCM or Hardmask material area.

Figure 7B:
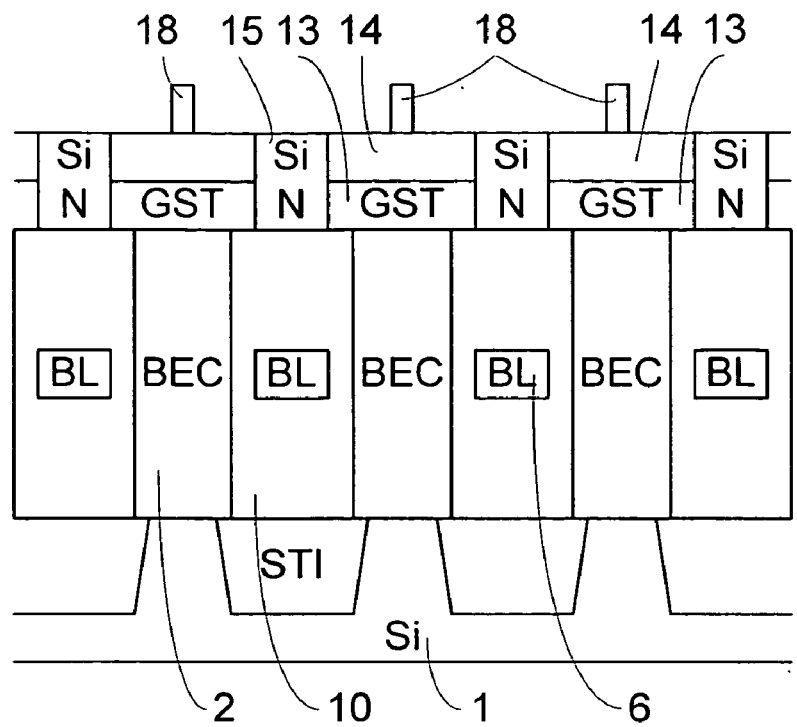

Similarly FIG. 7b is a view along intersecting line C-C' as defined FIG. 6d, which shows that the pieces of the first lamellar spacers 18 are protruding perpendicular as pillars on the hardmask area 14.

Each pillar will serve as upper electrode contact for the PCM material 13 of a memory cell. The width of a pillar along intersecting line D-D' is defined by the thickness of the TiN layer, which was used to form the first lamellar spacers 18. The depth of the pillar in FIG. 7a, that is of the fractions of the first lamellar spacers 18, which is the visible width in FIG. 7b along intersecting line C-C', is defined by the width of the second lamellar spacers 21. The height/elevation of a pillar is defined by the height/elevation of blocks 16, whose flange was used for agglomeration of the pillar material. Thus the outer dimensions of a pillar are not defined by the properties of any lithography process, but by the thickness of different material layers.

In a subsequent process step the material the hardmask 14 is removed by using an etching process being selective to the materials of the pillars, the gap fillers 15 and—as far as possible—to the phase change material GST. In a suitable etching process the pillars are used as a hardmask, so that the pillar stays electrically connected to the phase change material GST.

After this process step the memory cell has a top electrode and can be used after further steps of wiring.

In a preferred and optional embodiment the last etching process furthermore also partially removes the phase change material GST 13, so that a small discoidal piece 22 of the phase change material GST 13 is shaped, which connects the bottom of the pillar to the rest of the phase change material GST 13.

Figure 8A:
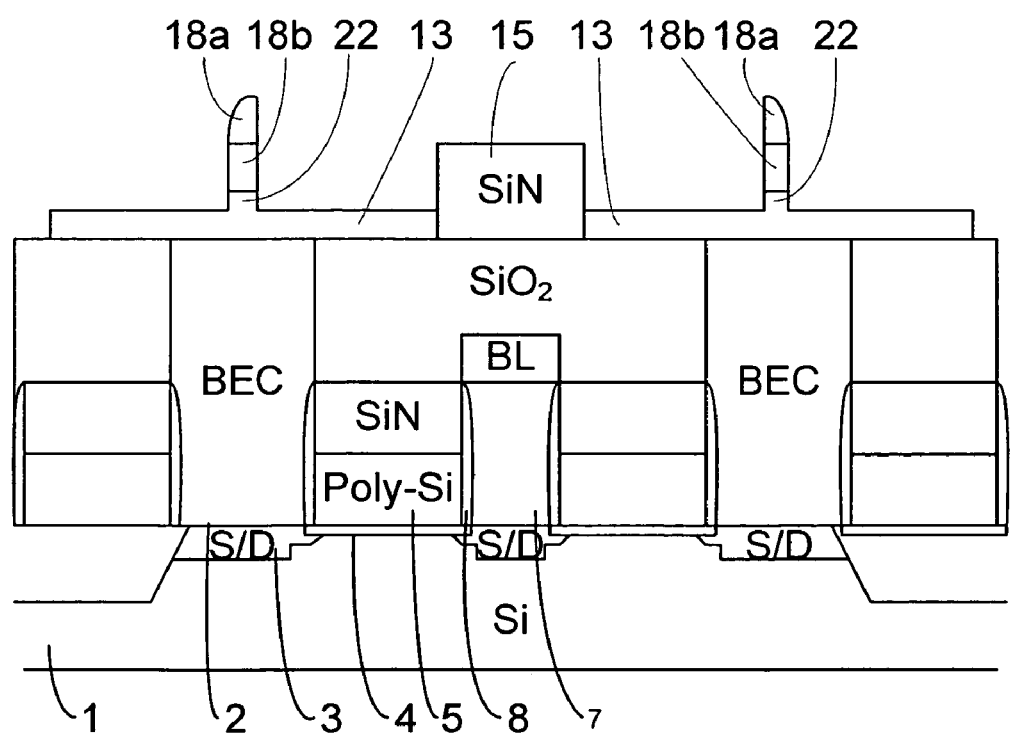
FIGS. 8a-8c show the chip after partial removal of the optional hardmask layer and partial removal of GST material.

FIG. 8*a* is a view along intersecting line D-D' showing the pillar shaped top electrode. The tip 18*a* results from a first lamellar spacer 18, a centerpiece 18*b* is formed from the hardmask material 14 and the bottom 18*c* of the top electrode contact is etched from phase change material 13.

Figure 8B:
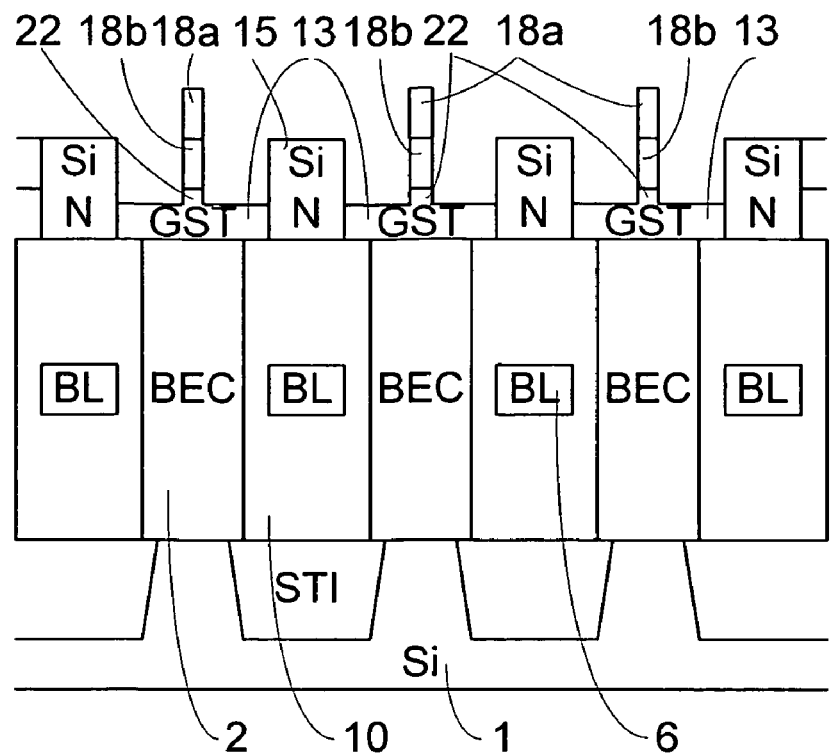

FIG. 8*b*, which is a view along intersecting line C-C', similarly discloses the different layers 18*a*, 18*b* and 18*c* of the top electrode contact.

Figure 8C:
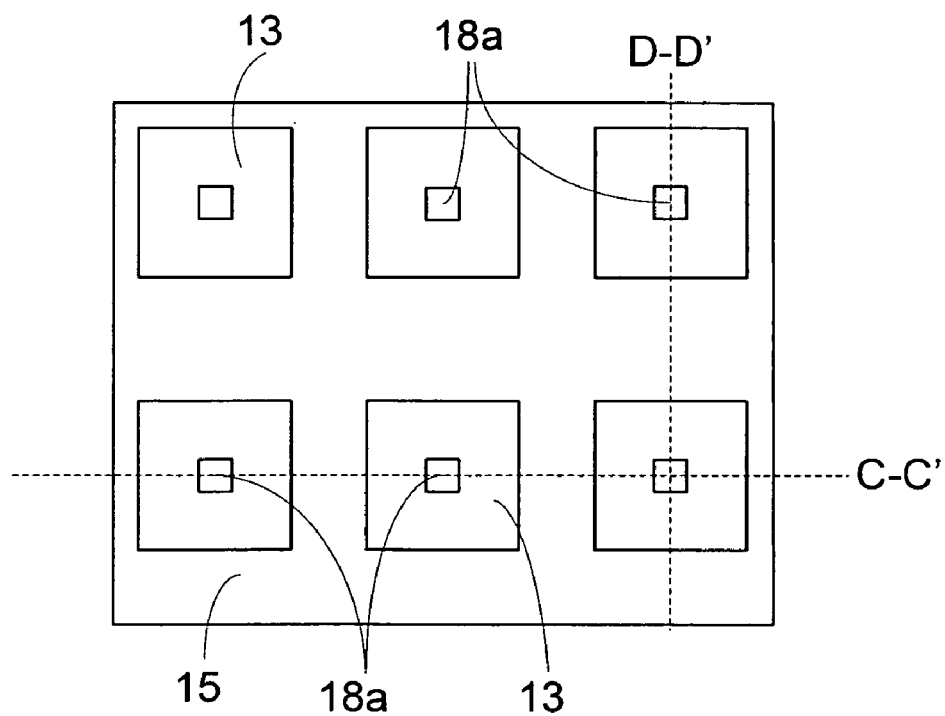

FIG. 8*c* is a top view onto the chip surface again. In this embodiment the hardmask material 14 is completely removed except under the pillar shaped top electrode contact. As can be seen the size of the area of the phase change material 13 is spaciously in comparison to the cross-sectional area of the electrode contact. As the contact area between the BEC 2—not shown in this drawing—and the phase change material 13 is by far bigger than the contact area of the top electrode, it is of minor importance where exactly the top electrode is located on the area of phase change material 13. Thus a big area of phase change material 13 is useful in cases where the top electrode contact is not placed in the center of the PCM material 13 due to fabrication inaccuracies.

As a last process step the surface of the chip now having the top electrode contact may be coated by a layer of insulation material, which serves as protection for the memory cells and as a layer to position further lines for wiring the memory cells. As is known from prior art a layer of $SiO_2$ can be used suitably, which can be deposited using e.g. a CVD process.

The small discoidal piece 22 of GST material 13 is the piece of phase change material with the highest current density. Hence this piece 22 is the location where the temperature for a phase change of the phase change material 13 will be reached first in the volume of the phase change material 13. As it is sufficient for a phase change memory cell that a very small piece of the material changes its conductivity and thus influences the conductivity of the entire memory cell, only the small discoidal piece 22 needs to be heated for a change of the conductivity of the memory cell.

So by etching the phase change material 13 with the pillar shaped top electrode contact as a mask the volume of phase change material to be heated for a change of the state of the cell can be reduced. As the outer dimensions of the pillar shaped top electrode and also the thickness of the removed phase change material 13 can be defined very accurately when etching from the surface, the size and thickness of the piece 22 of phase change memory material to be heated for a phase change can be defined very accurately.

As mentioned before partial removal of the GST material is optional. If the GST material is not partially removed, the discoidal piece 22 of GST material is not formed. However, if the current pulse flows through the pillar shaped electrode the highest current density in the GST Material is at the contact area of the pillar shaped electrode. Thus this will be the location where the temperature for a phase change will be reached first. Thus also in absence of the discoidal piece of PCM material, a fraction of the PCM material is heated for a phase change.

Thus in the fabrication method according to this invention at least one electrode contact is fabricated by using the proposed dual spacer approach. The proposed method steps enable the fabrication of extremely small electrode cross-sectional areas, wherein the proposed method steps being independent of lithography and the related restrictions.

What is claimed is:

1. A method for manufacturing at least one phase change memory cell having PCM material, comprising:
    (a) fabricating at least one first lamellar spacer of conductive material, which is electrically coupled to the PCM material of the memory cell;
    (b) fabricating at least one second lamellar spacer on top of the first lamellar spacer, wherein the second lamellar spacer crosses the first lamellar spacer in the area of the PCM material; and
    (c) partially removing the first lamellar spacer, wherein the second lamellar spacer serves as a hardmask for partially removing the first lamellar spacer, so that the first lamellar spacer forms at least one electrode contacting an area of PCM material.

2. The method of claim 1, further comprising removing the second lamellar spacer.

3. The method of claim 1, wherein a layer of conductive hardmask material is deposited on the PCM material prior to fabricating the first lamellar spacer.

4. The method of claim 1, further comprising:
    (e) partially removing the PCM material of each memory cell around the electrode, wherein the electrode serves as a mask, so that a small area of PCM material beneath the electrode is maintained.

5. The method of claim 3, further comprising:
    (e) partially removing the hardmask material and the PCM material of each memory cell, wherein the electrode serves as a mask, so that a small area of hardmask material and PCM material beneath the electrode is maintained.

6. The method of claim 1, further comprising, depositing and planarizing an insulation layer, wherein the electrodes are embedded in the insulation layer and are accessible for further wiring.

7. The method of claim 1, wherein the fabrication of the first lamellar spacer of step (a) comprises:
    (1) fabricating at least one first lamellar block on top of the PCM material of a cell, the block having a flange on top of at least one PCM material area of a memory cell;
    (2) depositing a layer of the conductive spacer material on top of the first lamellar block and on top of the PCM material area; and
    (3) removing the spacer material layer on areas being parallel to the surface of the PCM material area, so that an agglomeration of spacer material along the flange of the first lamellar block is maintained.

8. The method of claim 7, wherein an anisotropic etching method is used to remove the spacer material layer.

9. The method of claim 7, wherein a first lamellar block has the outer shape of an elongated cuboid, whose one flange runs on top of a first row of PCM material areas and whose parallel flange runs on top of a parallel, adjacent row of PCM material areas respectively.

10. The method of claim 1, wherein the fabrication of the second lamellar spacer comprises:
    (1) fabricating at least one second lamellar block on top of a first lamellar spacer, wherein one flange of the second lamellar block crosses the first lamellar spacer in the area of the PCM material;
    (2) depositing a layer of material on top of the second block; and
    (3) removing the layer material from areas being parallel to the surface of the PCM material areas, so that an agglomeration of material is maintained at least along one flange of the second block to form a second lamellar spacer.

11. The method of claim 10, wherein an anisotropic etching method is used to remove the layer material.

12. The method of claim 10, wherein one flange of the second lamellar block crosses a first lamellar spacer on top of a first row of PCM material areas and whose parallel flange crosses a first lamellar spacer on top of a parallel adjacent row of PCM material areas.

13. The method of claim 10, further comprising depositing and planarizing a layer of material to form a planar surface prior to executing step 1, wherein a first spacer is used as a stop when planarizing.

14. The method of claim 1, wherein the layer of the first lamellar spacer is deposited with a thickness of 5 nm to 20 nm.

15. The method of claim 1, wherein the material of the first lamellar spacer is selectively etchable with respect to the second lamellar spacer.

16. The method of claim 1, wherein the material of the first lamellar spacer is TiN.

17. The method of claim 1, wherein the material of the second lamellar spacer is selectively etchable with respect to the first lamellar spacer.

18. A memory device produced by a process, comprising:
(a) fabricating at least one first lamellar spacer of conductive material, which is electrically coupled to a PCM material of a phase change memory cell;
(b) fabricating at least one second lamellar spacer on top of the first lamellar spacer, wherein the second lamellar spacer crosses the first lamellar spacer in the area of the PCM material; and
(c) partially removing the first lamellar spacer, wherein the second lamellar spacer serves as a hardmask for partially removing the first lamellar spacer, so that the first lamellar spacer forms at least one electrode contacting an area of PCM material.

* * * * *